US007199038B2

(12) United States Patent
Miyajima

(10) Patent No.: US 7,199,038 B2
(45) Date of Patent: Apr. 3, 2007

(54) METHOD FOR FABRICATING SEMICONDUCTOR DEVICE

(75) Inventor: Hideshi Miyajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/974,850

(22) Filed: Oct. 28, 2004

(65) Prior Publication Data
US 2005/0112863 A1 May 26, 2005

(30) Foreign Application Priority Data
Oct. 31, 2003 (JP) ............................. 2003-372443

(51) Int. Cl.
*H01L 21/4763* (2006.01)
(52) U.S. Cl. ..................... 438/618; 438/680; 438/692; 438/700; 257/E21; 257/17; 257/245; 257/304; 257/576
(58) Field of Classification Search ................ 438/637, 438/700, 584, 660, 680, 687, 663, 692, 706, 438/672, 723, 724, 743, 744, 740, 741, 781, 438/782
See application file for complete search history.

(56) References Cited

U.S. PATENT DOCUMENTS 6,607,991 B1 *  8/2003  Livesay et al. ............. 438/787
6,613,664 B2 *  9/2003  Barth et al. ................. 438/629
6,756,299 B2 *  6/2004  Nagashima ................. 438/637
6,812,535 B2 * 11/2004  Yagishita et al. ........... 257/410

FOREIGN PATENT DOCUMENTS

CN          1373512 A       10/2002

OTHER PUBLICATIONS

C. Y. Wang et al.; "Elimination of O₂ plasma damage O f Low-k methyl silsesquioxane film by As implantation ", Thin Solid Films, vol. 397, pp. 90-94 (2001).
P. Liu et al.: "Effective Strategy for Porous Organosilicate to Supress Oxygen Ashing Damage", Electrochemical and Solid-State Letters, (USA), vol. 5, pp. G11-14 (2002).
Ryan et al. "Integration Damage in Organosilicate Glass Films", Proceeding of IEEE 2002 International Interconnect Technology Conference (USA) 294, pp. 27-29 (2002).
Office Action issued by the Patent Office of the People's Republic of China dated Mar. 10, 2006.

* cited by examiner

*Primary Examiner*—David Nhu
(74) *Attorney, Agent, or Firm*—Finnegan, Henderson, Farabow, Garrett & Dunner, L.L.P.

(57) ABSTRACT

According to an aspect of the invention, there is provided a method for fabricating a semiconductor device. The method may include forming at least one interconnection layer having a low dielectric constant insulating film and an interconnection buried in the low dielectric constant insulating film, forming a trench or a hole extending in the interconnection layer, performing heat treatment for the interconnection layer having the trench or the hole, and burying a material in the trench or the hole.

20 Claims, 6 Drawing Sheets

METHOD FOR FABRICATING SEMICONDUCTOR DEVICE

CROSS-REFERENCE TO RELATED APPLICATIONS

This application is based upon and claims the benefit of priority from prior Japanese Patent Application No. 2003-372443, filed Oct. 31, 2003, the entire contents of which are incorporated herein by reference.

BACKGROUND OF THE INVENTION

1. Field of the Invention

The present invention relates to a method for fabricating a semiconductor device and, more particularly, to a method for fabricating a semiconductor device having an interconnection layer using a low dielectric constant insulating film.

2. Description of the Related Art

As semiconductor devices shrink in dimension and increase in speed, the interconnection structure advances from a single-level structure to a multilevel structure. Semiconductor devices having a metal interconnection structure of five layers or more have been developed and produced. As miniaturization progresses, problems arise from a signal transfer delay caused by a so-called parasitic capacitance between interconnections and the interconnection resistance. Recently, the signal transfer delay caused by a multilevel interconnection structure lowers the speed of semiconductor devices much more, and various measures have been adopted.

In general, the signal transfer delay can be given by the product of the parasitic capacitance between interconnections and the interconnection resistance. In order to reduce the interconnection resistance, shift from a conventional aluminum interconnection to a low-resistance copper interconnection has been examined. The use of copper requires a buried interconnection structure because it is very difficult for the existing technique to process copper into an interconnection shape by dry etching similar to a conventional method. In order to reduce the capacitance between interconnections, an application of a low dielectric constant insulating film formed from an SiOF film by CVD, a so-called SOG (Spin on Glass having a SiCO composition) film by spin coating, or an organic resin (polymer) film has been examined instead of an insulating film by CVD using a conventional silicon oxide ($SiO_2$).

The relative dielectric constant of the SiOF film can be generally reduced to about 3.4 (that of the conventional $SiO_2$ film is 3.9). However, a further decrease in relative dielectric constant is practically very difficult in terms of the stability of the film. To the contrary, the relative dielectric constant of a low dielectric constant film such as the SOG film or organic resin film can be reduced to about 2.0, so that applications of these films are enthusiastically examined at present. In recent years, an SiCO film by CVD also becomes popular.

As a representative method for forming a buried interconnection, steps of forming an interconnection layer on an underlayer having a buried interconnection formed in advance are (1) formation of an etching stopper film, (2) formation of an interlayer dielectric film, (3) formation of a cap film, (4) formation of a mask for a via hole, (5) formation of a via hole, (6) removal of the mask, (7) formation of a mask for an interconnection trench, (8) formation of an interconnection trench, (9) removal of the mask, (10) formation of an opening in an etching stopper film, (11) formation of a barrier metal and seed Cu film, (12) formation of a plating Cu film, and (13) polishing and planarization by CMP and formation of a buried Cu interconnection. In general, the interlayer dielectric film is a low dielectric constant film, and the cap film is a conventional $SiO_2$ film.

These days, multilevel interconnections of an LSI are stacked, and interconnection layers using low dielectric constant films are also stacked by repeating the above process scheme.

As the interlayer dielectric film using a low dielectric constant film, an SiCO film by spin coating or CVD is used as described above. The low dielectric constant film is known to be damaged in film deposition step (3), dry etching steps (5), (8), and (10), and mask removal steps (6) and (9) using plasma ashing and cleaning with a chemical, particularly in steps (3), (6), and (9). As for the SiCO film, an organic component (C component) in the film is influenced during these steps, and an Si—OH group as a water adsorption site is formed in the film to increase the hygroscopicity of the film. If water is adsorbed in the insulating film, it oxidizes a metal interconnection in subsequent steps, especially in heat treatment, and degrades the reliability of the interconnection.

BRIEF SUMMARY OF THE INVENTION

According to an aspect of the invention, there is provided a method for fabricating a semiconductor device, comprising: forming at least one interconnection layer having a low dielectric constant insulating film and an interconnection buried in the low dielectric constant insulating film; forming a trench or a hole extending in the interconnection layer; performing heat treatment for the interconnection layer having the trench or the hole; and burying a material in the trench or the hole.

DETAILED DESCRIPTION OF THE INVENTION

An embodiment will be described below with reference to the several views of the accompanying drawing.

FIGS. 1 to 11 are partial sectional views showing steps of forming a multilevel interconnection structure in a semiconductor device fabricating method according to the embodiment. The multilevel interconnection structure formation steps will be explained with reference to FIGS. 1 to 11.

Figure 1:
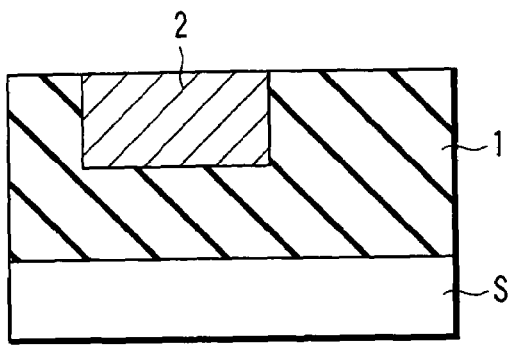
FIG. 1 is a partial sectional view showing a step of forming a multilevel interconnection structure in a semiconductor device fabricating method according to an embodiment.
Figure 2:
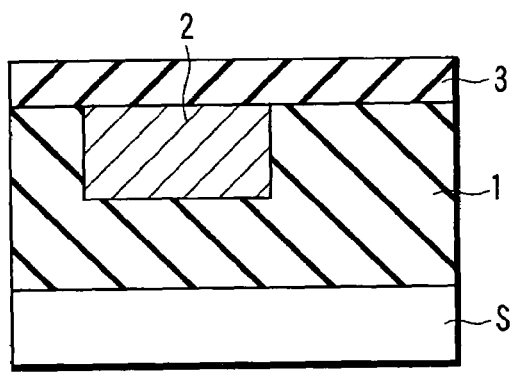
FIG. 2 is a partial sectional view showing another step of forming a multilevel interconnection structure in the semiconductor device fabricating method according to the embodiment.
Figure 3:
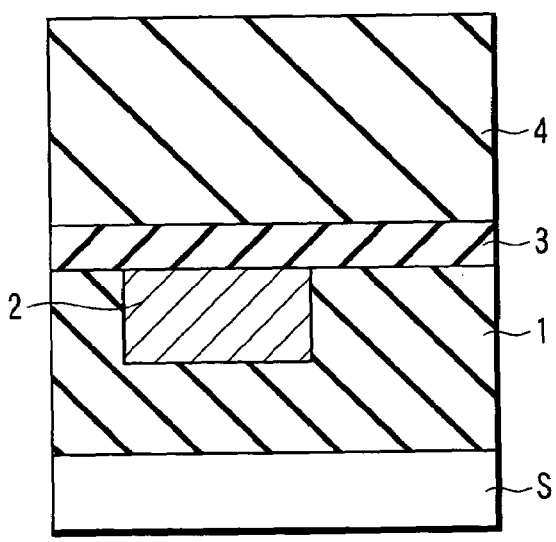
FIG. 3 is a partial sectional view showing still another step of forming a multilevel interconnection structure in the semiconductor device fabricating method according to the embodiment.

As shown in FIG. 1, a semiconductor element (not shown) and the like is formed on a semiconductor substrate (Si substrate) S, and a low dielectric constant insulating film 1 (e.g., SiCO:H film) is deposited on the semiconductor substrate S by plasma CVD. A copper interconnection 2 (barrier metal and copper interconnection) is buried in the low dielectric constant insulating film 1 by a known damascene process. As shown in FIG. 2, an SiCN:H film 3 serving as an etching stopper film is deposited to 50 nm on the low dielectric constant insulating film 1 by plasma CVD. At this time, organic silane (alkylsilane) and $NH_3$ are adopted as source gases. As shown in FIG. 3, an SiCO:H film 4 is deposited to 350 nm on the SiCN:H film 3 by plasma CVD. The SiCO:H film is a so-called low dielectric constant insulating film, and its relative dielectric constant is reduced from about 3.9 of a conventional film to about 2.9. At this time, organic silane (alkylsilane) and $O_2$ are used as source gases.

Figure 4:
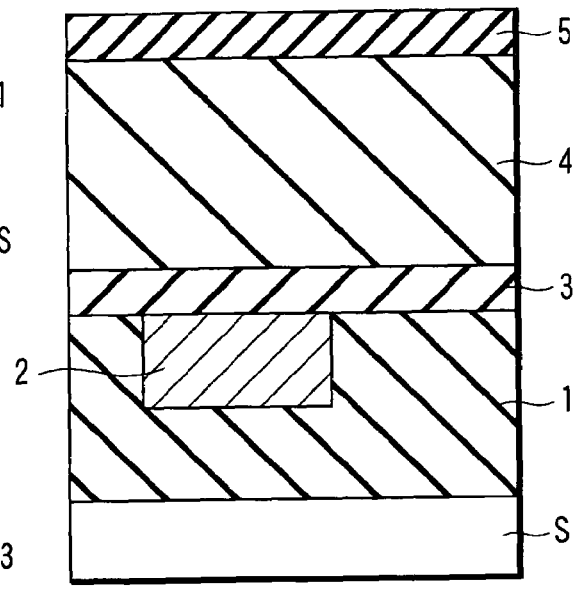
FIG. 4 is a partial sectional view showing still another step of forming a multilevel interconnection structure in the semiconductor device fabricating method according to the embodiment.
Figure 5:
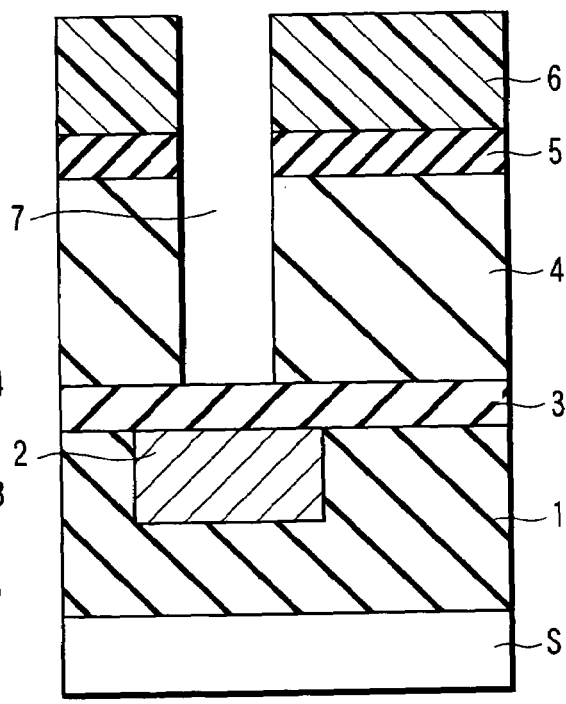
FIG. 5 is a partial sectional view showing still another step of forming a multilevel interconnection structure in the semiconductor device fabricating method according to the embodiment.

As shown FIG. 4, an $SiO_2$ film 5 serving as a cap film is deposited to 100 nm on the SiCO:H film 4 by plasma CVD. At this time, organic silane (alkoxysilane) and $O_2$ are used as source gases. After that, as shown in FIG. 5, a resist mask 6 is patterned by photolithography and used as an etching mask to process the $SiO_2$ film 5 and SiCO:H film 4 by RIE (Reactive Ion Etching), thereby forming a via hole 7.

Figures 6, 8:
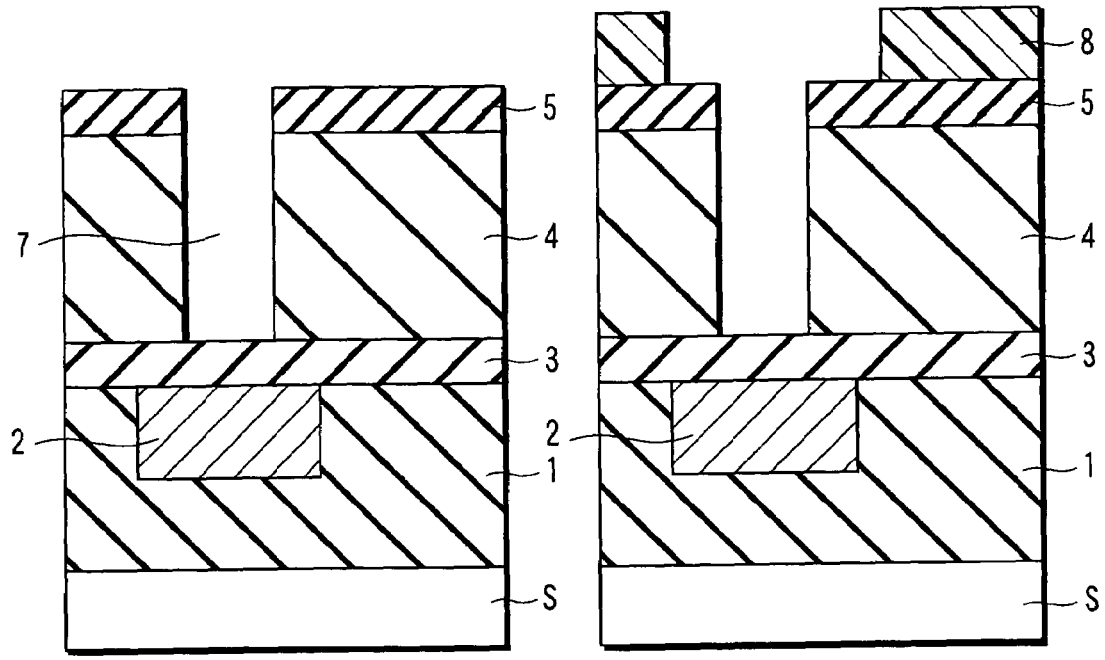
FIG. 6 is a partial sectional view showing still another step of forming a multilevel interconnection structure in the semiconductor device fabricating method according to the embodiment.
FIG. 8 is a partial sectional view showing still another step of forming a multilevel interconnection structure in the semiconductor device fabricating method according to the embodiment.
Figures 7, 9:
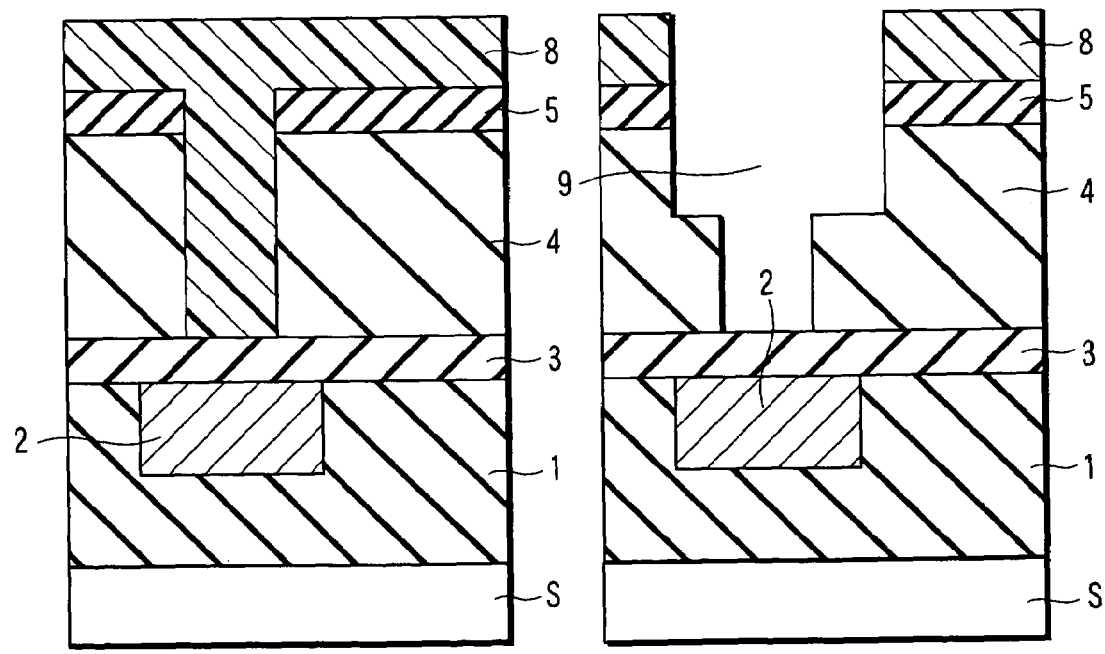
FIG. 7 is a partial sectional view showing still another step of forming a multilevel interconnection structure in the semiconductor device fabricating method according to the embodiment.
FIG. 9 is a partial sectional view showing still another step of forming a multilevel interconnection structure in the semiconductor device fabricating method according to the embodiment.

As shown in FIG. 6, the resist mask 6 is removed with discharged $O_2$ gas. A resist mask 8 for forming an interconnection trench is applied, as shown in FIG. 7, and patterned by photolithography, as shown in FIG. 8. As shown in FIG. 9, an interconnection trench 9 is formed by RIE using the resist mask 8 as a mask.

Figure 10:
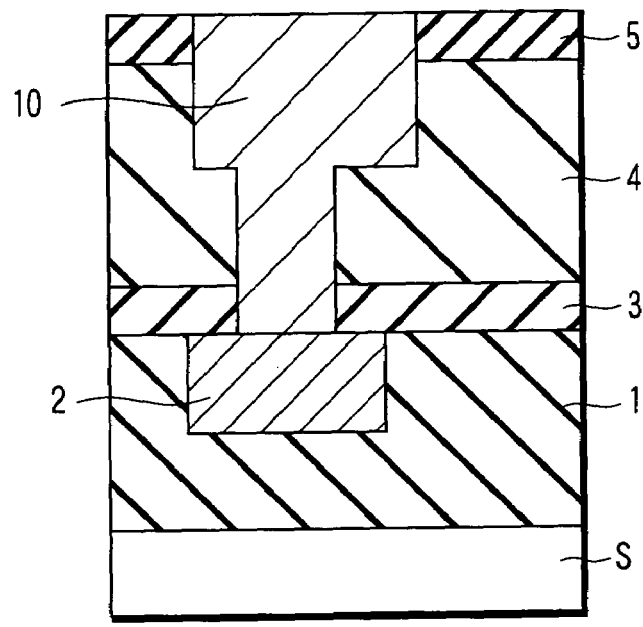
FIG. 10 is a partial sectional view showing still another step of forming a multilevel interconnection structure in the semiconductor device fabricating method according to the embodiment.
Figure 11:
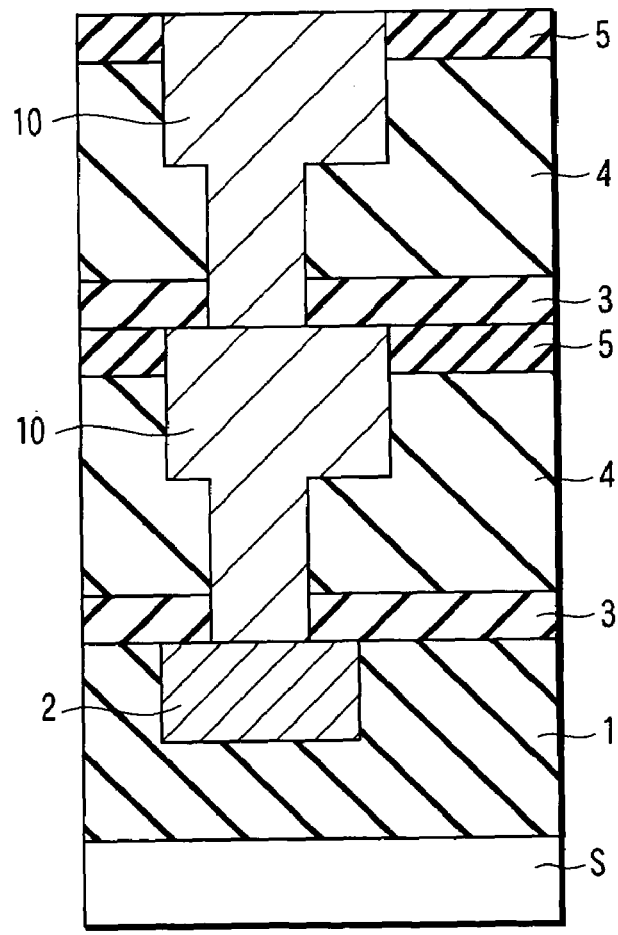
FIG. 11 is a partial sectional view showing still another step of forming a multilevel interconnection structure in the semiconductor device fabricating method according to the embodiment.

Thereafter, as shown in FIG. 10, the resist mask 8 is removed with discharged $O_2$ gas, and the SiCN:H film 3 at the bottom of the via hole 7 is processed by RIE, completing a recess for a buried interconnection. In practice, a barrier metal layer and Cu seed layer are formed by sputtering, Cu is buried in the interconnection trench 9 and via hole 7 by electroplating, and Cu on the $SiO_2$ film 5 is removed by CMP (Chemical Mechanical Polishing) to form a copper interconnection 10 (barrier metal and copper interconnection). By repeating this process, a multilevel interconnection structure is formed, as shown in FIG. 11.

Figure 12:
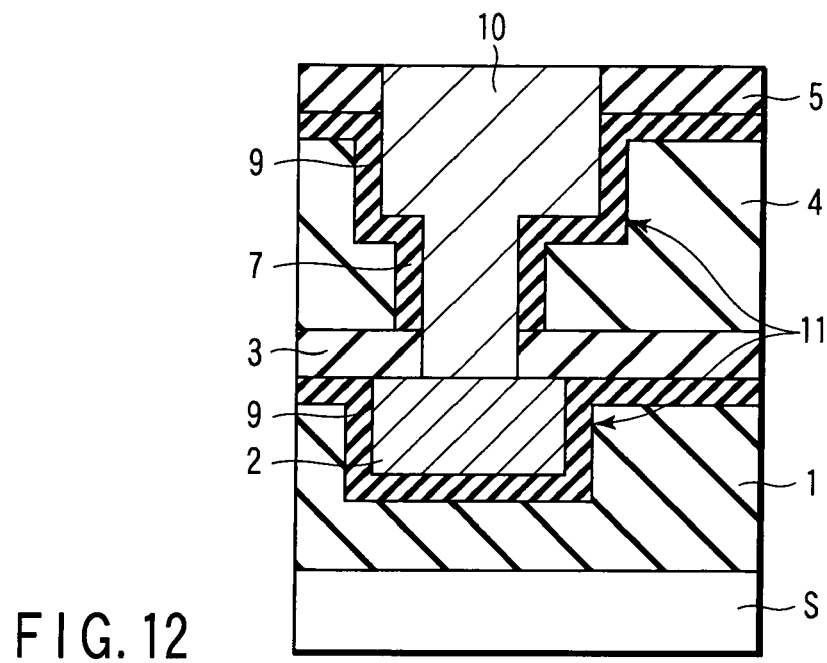
FIG. 12 is a sectional view showing a damage layer in the multilevel interconnection structure formation step.

These steps are the same as the conventional ones. In the multilevel interconnection structure formed by these steps, the performance of a semiconductor device degrades under the influence of subsequent steps, particularly heat treatment, or with the lapse of time, and the interconnection may disconnect at last. This failure is considered to be caused by forming damage layers 11 at interfaces on the insulating film 1 and SiCO:H film 4 serving as low dielectric constant insulating films, on the side and bottom surfaces of the interconnection trench 9, and the side surface of the via hole 7, as shown in FIG. 12, by the above-mentioned three steps:

(1) step of depositing the $SiO_2$ film 5 to 100 nm by plasma CVD (FIG. 4), (2) step of removing the resist mask 6 with discharged $O_2$ gas (FIG. 6), and (3) step of removing the resist mask 8 with discharged $O_2$ gas (FIG. 10)

The surface of the low dielectric constant insulating film is oxidized by discharge of oxygen in steps (1) to (3). Since the low dielectric constant insulating film contains a methyl group, the following reaction is considered to occur:

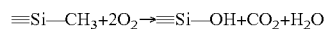

$$\equiv Si-CH_3 + 2O_2 \rightarrow \equiv Si-OH + CO_2 + H_2O$$

where $\equiv Si-CH_3$ is a methyl group contained in the SiCO film.

Since the formed $\equiv Si-OH$ group functions as a so-called water adsorption site which adsorbs water ($H_2O$), a water-adsorbed damage layer is formed particularly at the portion of the low dielectric constant insulating film near a metal interconnection. Especially in a subsequent high-temperature heat treatment step, the metal interconnection is oxidized by water and disconnects. Suppressing formation of the damage layer which adsorbs water has conventionally been tried by improving the formation process, but this problem cannot be solved.

When the multilevel interconnection structure shown in FIG. 11 is formed by the above steps, the damage layer 11 as shown in FIG. 12 is formed on the low dielectric constant insulating film near the metal interconnection, similar to the conventional structure. In this state, an interconnection failure occurs owing to water contained in the damage layer 11. The embodiment prevents the interconnection failure by the following steps.

Figure 13:
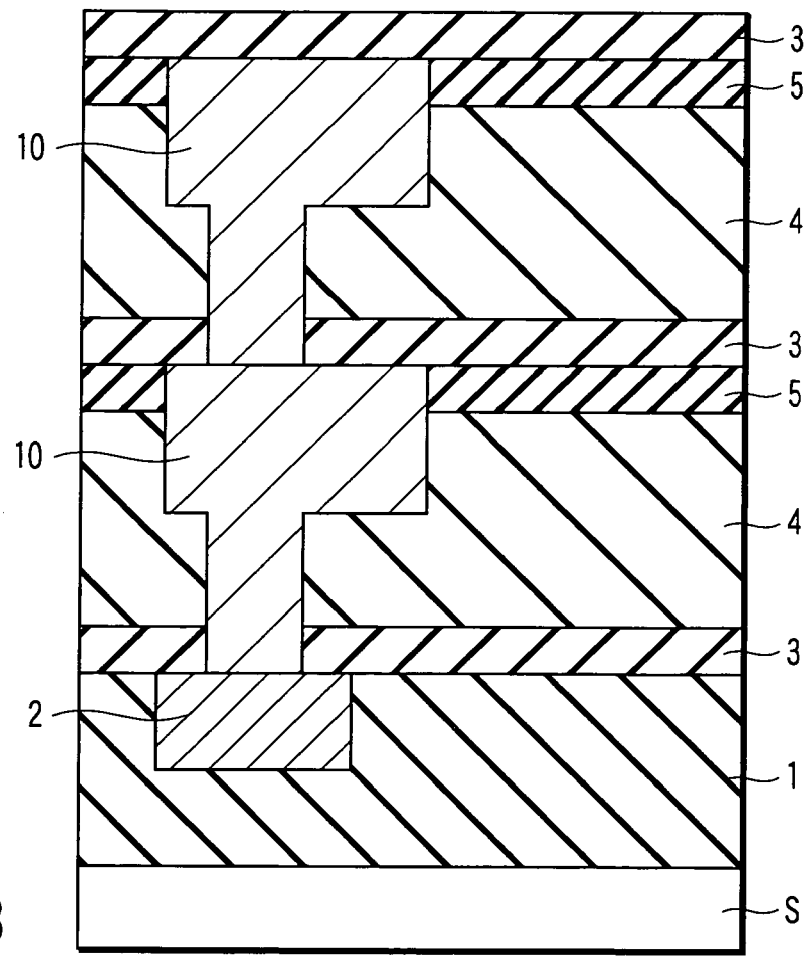
FIG. 13 is a partial sectional view showing a step of forming an interconnection failure prevention structure in the semiconductor device fabricating method according to the embodiment.
Figure 14:
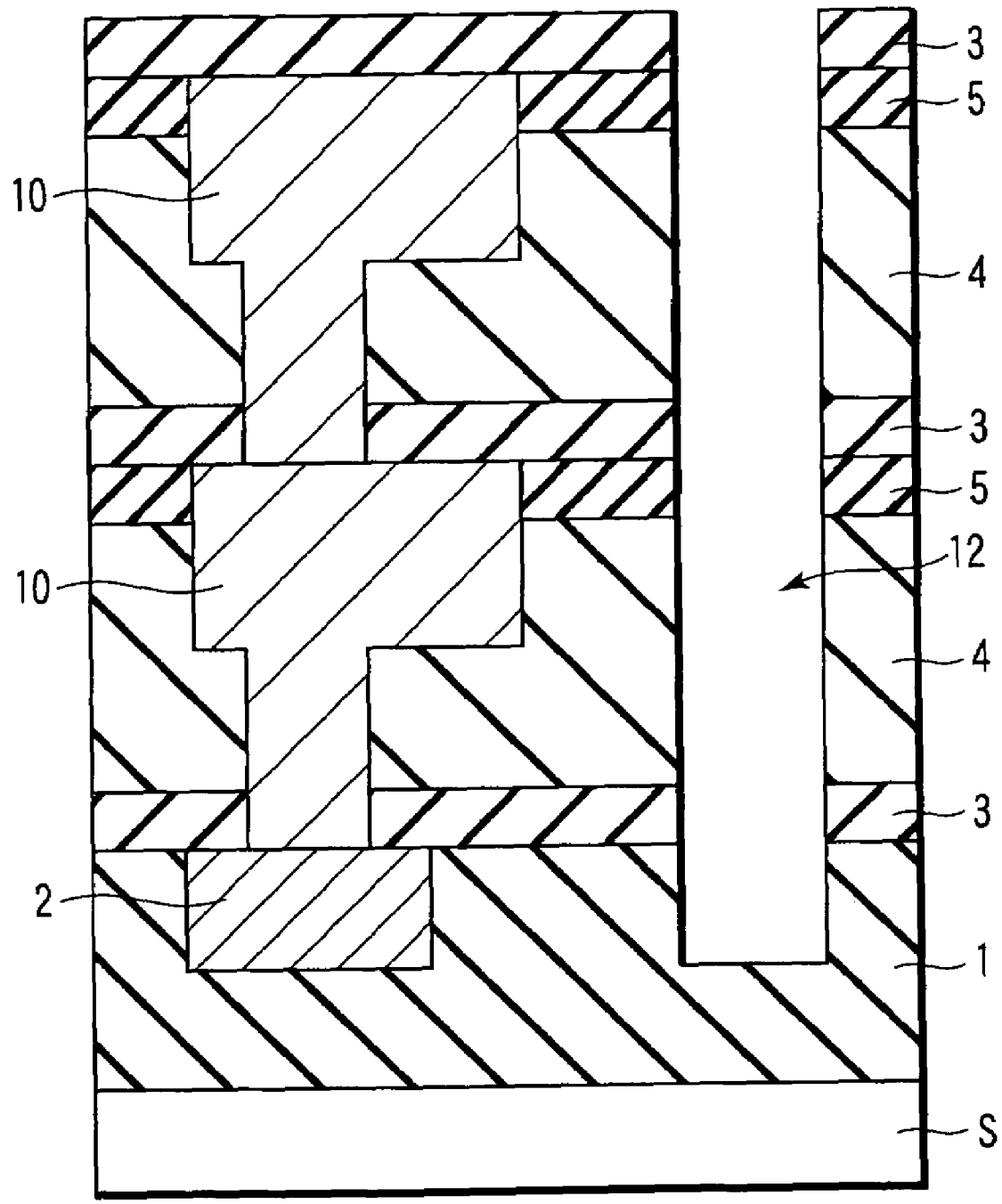
FIG. 14 is a partial sectional view showing another step of forming an interconnection failure prevention structure in the semiconductor device fabricating method according to the embodiment.
Figure 15:
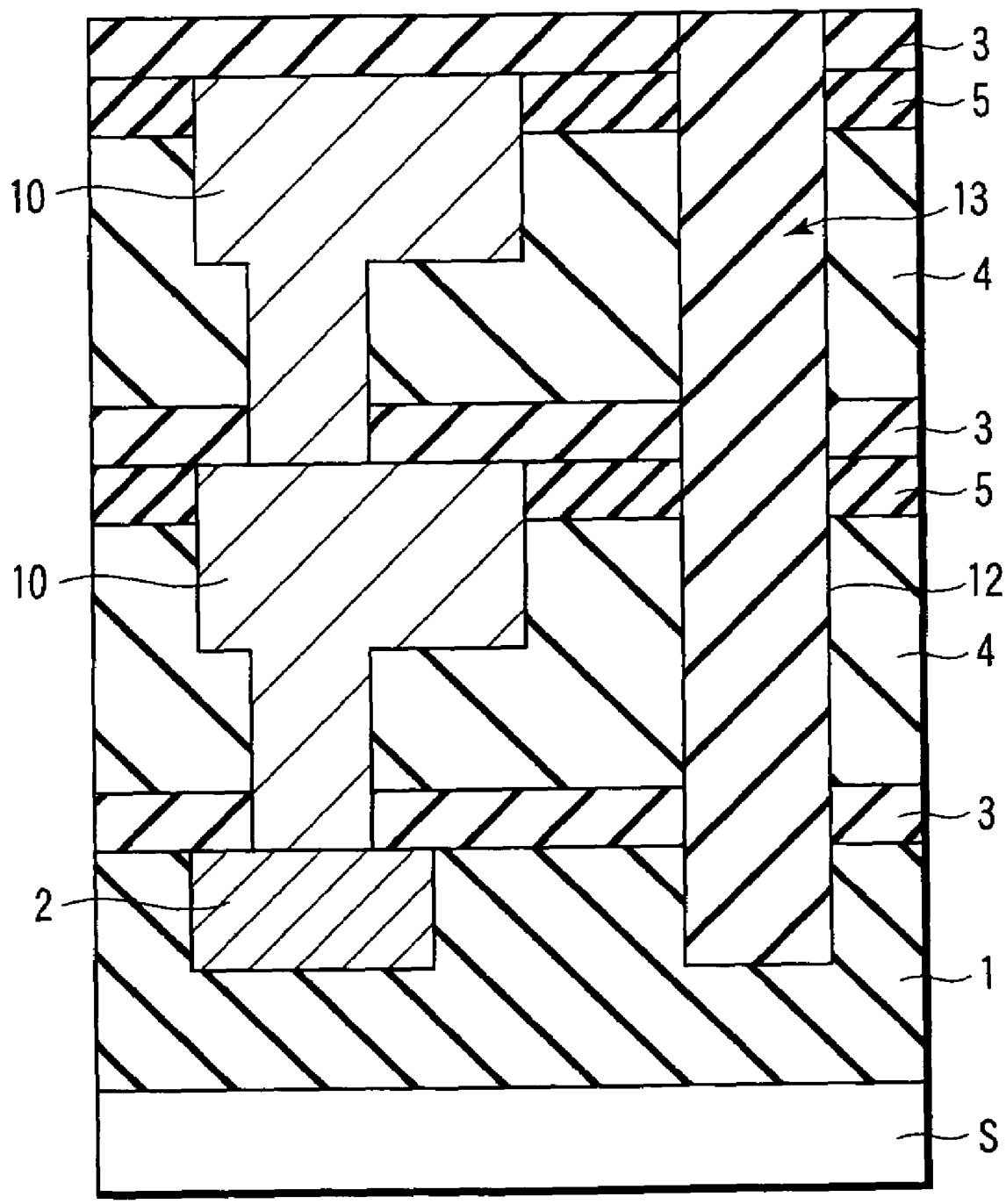
FIG. 15 is a partial sectional view showing still another step of forming an interconnection failure prevention structure in the semiconductor device fabricating method according to the embodiment.

FIGS. 13 to 15 are partial sectional views showing steps of forming an interconnection failure prevention structure in the semiconductor device fabricating method according to the embodiment. In FIGS. 13 to 15, the same reference numerals as in FIGS. 1 to 11 denote the same parts. The steps of forming an interconnection failure prevention structure will be explained with reference to FIGS. 13 to 15.

As shown in FIG. 13, a multilevel interconnection with a predetermined number of layers using low dielectric constant insulating films are formed, and the SiCN:H film 3 serving as a stopper film is formed as the uppermost layer. As shown in FIG. 14, a trench structure or hole structure 12 is so formed as to extend through the respective interconnection layers. The trench structure or hole structure 12 is formed by patterning a mask (not shown) on the uppermost SiCN:H film 3 and forming a trench or hole by dry etching using the mask. After formation, the mask is removed by $O_2$ ashing. The trench structure or hole structure 12 can be formed at an arbitrary position in the semiconductor device as far as the trench structure or hole structure 12 extends through the interconnection layers with a shape which does not interfere with the interconnections. For example, the trench structure or hole structure 12 can also be formed annularly along the edge of a single semiconductor device.

After that, the multilevel interconnection structure undergoes heat treatment (annealing) using an annealing apparatus in an atmospheric-pressure nitrogen atmosphere at 250° C. for 20 min. This heat treatment sufficiently desorbs water contained in the film 1 and films 4 of lower layers via the trench structure or hole structure 12 extending through the interconnection layers. Heat treatment is not limited to 250° C. but can be executed within a range of 100° C. (inclusive) to 400° C. (inclusive). Water can evaporate at 100° C. or more, and a temperature of 400° C. or less does not degrade the interconnection layers.

After heat treatment, as shown in FIG. 15, an $SiO_2$ thin film is formed using an atmospheric-pressure CVD apparatus to bury an $SiO_2$ film 13 in the trench structure or hole structure 12. After filling, the surface of the uppermost layer is planarized again by CMP. This process effectively removes water contained in the damage layer.

The effect of reducing the failure occurrence rate of a semiconductor device fabricated by the above method was verified by conducting an accelerated test which is a method in the field of reliability techniques. A semiconductor device fabricated by a conventional method and a semiconductor device fabricated by the method according to the embodiment were heated in an atmospheric-pressure nitrogen atmosphere at 225° C., and the disconnection failure occurrence frequency of interconnections was measured using the degree of rise of the interconnection resistance as a criterion. The semiconductor device fabricated by the method according to the embodiment exhibited a failure rate of 0.1% even after 500 h, whereas the semiconductor device fabricated by the conventional method exhibited a failure rate of 52%. This result confirmed that the method for the embodiment was much more effective than the conventional method.

Note that the embodiment employs a structure in which in each layer, a copper interconnection is buried in an interlayer dielectric film having a two-layered structure of a low dielectric constant insulating film and $SiO_2$ film, but the present invention is not limited to this structure. The same effects can also be obtained by a structure using an interlayer dielectric film of a single layer or three or more layers.

The embodiment uses an SiCN:H film as an etching stopper film, but the present invention is not limited to this film. The same effects can also be obtained by an insulating film (e.g., SiC:H film, SiCO:H film, SiN film, or SiN:H film) which suppresses diffusion of Cu.

The embodiment adopts an SiCO:H film as a low dielectric constant film, but the present invention is not limited to this film. The same effects can also be obtained by a low dielectric constant insulating film having a relative dielectric constant lower than 3.9 which is the relative dielectric constant of an $SiO_2$ film. The embodiment performs annealing as heat treatment at 250° C. for 20 min, but the present invention is not limited to this temperature and time. The same effects can be attained at a temperature of 100° C. or more.

The embodiment forms an $SiO_2$ film as a buried material by atmospheric-pressure CVD to bury $SiO_2$, but the present invention is not limited to this method. The same effects can also be attained by another film formation method such as plasma CVD, low-pressure CVD, vapor deposition, or coating. The atmospheric gas is not limited to nitrogen gas, and annealing may be done in another inert gas atmosphere (e.g., diluent gas) or vacuum atmosphere.

The embodiment uses an $SiO_2$ insulator as a material buried in a trench or hole, but the present invention is not limited to this. The same effects can also be obtained by burying a metal such as tungsten or copper by sputtering, CVD, plating, or the like, burying a semiconductor such as silicon, or burying an SiOC film.

As has been described above, according to the embodiment, an interconnection layer of a single layer or a multi-level interconnection layer of two or more layers is formed in an interconnection structure using a low dielectric constant insulating film and buried copper interconnection. A trench or hole is so formed as to extend through the respective interconnection layers, and the resultant structure undergoes heat treatment to desorb water from damage layers formed in the interconnection layers, so that water contained in the low dielectric constant insulating films of the interconnection layers is removed to reduce interconnection failures. Furthermore, by filling the trench or hole extending through the interconnection layers with buried material, the adhesive property at the interface between interlayer dielectric films having different compositions is enhanced especially when interlayer dielectric films of two or more layers are formed. This is effective for preventing peeling at the interface in subsequent steps, particularly in dicing or the like.

The embodiment of the present invention can provide a semiconductor device which reduces interconnection failures and a method for fabricating the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A method for fabricating a semiconductor device, comprising:

forming at least one interconnection layer having a low dielectric constant insulating film and an interconnection buried in the low dielectric constant insulating film;

forming a trench or a hole extending in the interconnection layer;

performing heat treatment for the interconnection layer having the trench or the hole; and burying a material in the trench or the hole.

2. A method according to claim 1, wherein the interconnection layer has at least two insulating films with different compositions.

3. A method according to claim 1, wherein the low dielectric constant insulating film contains at least Si and O.

4. A method according to claim 3, wherein the low dielectric constant insulating film further contains at least C and H.

5. A method according to claim 1, wherein the interconnection layer has a structure obtained by stacking a stopper film, the low dielectric constant insulating film, and a cap film.

6. A method according to claim 5, wherein the low dielectric constant insulating film contains at least Si and O.

7. A method according to claim 6, wherein the low dielectric constant insulating film further contains at least C and H.

8. A method according to claim 7, wherein the stopper film contains at least Si and N.

9. A method according to claim 8, wherein the stopper film further contains at least C and H.

10. A method according to claim 7, wherein the cap film includes an $SiO_2$ film.

11. A method according to claim 1, wherein the interconnection layer is formed by forming the low dielectric constant insulating film, forming an interconnection trench in the low dielectric constant insulating film, and burying an interconnection in the interconnection trench.

12. A method according to claim 11, wherein the interconnection trench is formed by forming a mask pattern above the low dielectric constant insulating film, dry-etching the low dielectric constant insulating film by using the mask pattern as a mask, and removing the mask pattern by ashing after dry-etching.

13. A method according to claim 1, wherein the heat treatment is performed at not less than 100° C. and not more than 400° C.

14. A method according to claim 1, wherein the heat treatment is performed in an inert gas atmosphere or a vacuum atmosphere.

15. A method according to claim 1, wherein the buried material includes an insulator.

16. A method according to claim 15, wherein the insulator includes $SiO_2$.

17. A method according to claim 1, wherein the buried material includes a metal.

18. A method according to claim 1, wherein the buried material includes a semiconductor.

19. A method according to claim 1, wherein the trench is formed along an edge of the semiconductor device.

20. A method according to claim 1, wherein the trench or the hole is so formed as to extend through a plurality of interconnection layers each having the low dielectric constant insulating film and the interconnection.

* * * * *